(12) United States Patent
Rightnowar

(10) Patent No.: US 12,245,407 B2
(45) Date of Patent: Mar. 4, 2025

(54) AIRCRAFT AND METHOD FOR THERMAL MANAGEMENT

(71) Applicant: GE AVIATION SYSTEMS LLC, Grand Rapids, MI (US)

(72) Inventor: Ronald Jacob Rightnowar, Alto, MI (US)

(73) Assignee: GE Aviation Systems LLC, Grand Rapids, MI (US)

( * ) Notice: Subject to any disclaimer, the term of this patent is extended or adjusted under 35 U.S.C. 154(b) by 28 days.

(21) Appl. No.: 18/447,423

(22) Filed: Aug. 10, 2023

(65) Prior Publication Data
US 2023/0389239 A1    Nov. 30, 2023

Related U.S. Application Data

(63) Continuation of application No. 16/831,149, filed on Mar. 26, 2020, now Pat. No. 11,765,871.

(51) Int. Cl.
| | |
|---|---|
| *G06F 1/16* | (2006.01) |
| *B64D 41/00* | (2006.01) |
| *H05K 5/00* | (2006.01) |
| *H05K 7/00* | (2006.01) |
| *H05K 7/20* | (2006.01) |

(52) U.S. Cl.
CPC ......... *H05K 7/20881* (2013.01); *B64D 41/00* (2013.01); *H05K 7/20336* (2013.01)

(58) Field of Classification Search
CPC ........... H05K 7/20881; H05K 7/20336; H05K 7/20936; H05K 7/208; H05K 7/20663; H05K 7/2029; B64D 41/00
See application file for complete search history.

(56) References Cited

U.S. PATENT DOCUMENTS

| | | | | |
|---|---|---|---|---|
| 4,000,776 A | * | 1/1977 | Kroebig | F28D 15/06 165/274 |
| 4,673,030 A | * | 6/1987 | Basiulis | G05D 23/01 165/41 |
| 5,702,073 A | * | 12/1997 | Fluegel | F28F 13/00 165/44 |
| 7,325,772 B1 | * | 2/2008 | Hanewinkel, III | B64U 30/10 165/41 |
| 7,967,249 B2 | * | 6/2011 | Muhlthaler | B64D 11/04 244/57 |
| 8,926,272 B2 | * | 1/2015 | Schank | B64C 27/615 244/17.11 |
| 9,382,013 B2 | * | 7/2016 | Murray | B64G 1/506 |

(Continued)

FOREIGN PATENT DOCUMENTS

| | | |
|---|---|---|
| CN | 101420838 A | 4/2009 |
| CN | 102007832 A | 4/2011 |

(Continued)

*Primary Examiner* — Anthony M Haughton
(74) *Attorney, Agent, or Firm* — McGarry Bair PC

(57) ABSTRACT

A passive cooling system for aircraft electronics includes an electronics chassis having a chassis exterior and defining a chassis interior; a heat spreader having a body located in the chassis interior; a heatsink located in the chassis interior; a cold plate operably coupled to the electronic chassis and thermally coupled to the heatsink; a first plurality of heat pipes thermally coupled with the cold plate; and a second plurality of heat pipes thermally coupling the heatsink with the heat spreader.

20 Claims, 4 Drawing Sheets

(56) References Cited

U.S. PATENT DOCUMENTS

| | | | | |
|---|---|---|---|---|
| 9,909,448 | B2* | 3/2018 | Gerstler | F01D 9/04 |
| 9,921,003 | B2* | 3/2018 | Monson | F28D 15/0275 |
| 2006/0146496 | A1* | 7/2006 | Asfia | H05K 7/20672 |
| | | | | 361/700 |
| 2012/0140403 | A1* | 6/2012 | Lau | H05K 7/20718 |
| | | | | 361/679.48 |
| 2012/0298337 | A1* | 11/2012 | Tiwari | H05K 7/20681 |
| | | | | 165/104.34 |
| 2015/0000871 | A1* | 1/2015 | Farner | H05K 7/20681 |
| | | | | 165/104.21 |
| 2015/0068703 | A1* | 3/2015 | de Bock | B64D 13/00 |
| | | | | 165/41 |
| 2015/0327402 | A1* | 11/2015 | Slippey | H05K 7/20336 |
| | | | | 361/714 |
| 2017/0339805 | A1 | 11/2017 | Lassini et al. | |
| 2019/0350111 | A1* | 11/2019 | Bodla | F24S 10/95 |
| 2020/0042053 | A1* | 2/2020 | Cheng | H05K 7/20509 |

FOREIGN PATENT DOCUMENTS

| | | |
|---|---|---|
| CN | 101095386 B | 6/2012 |
| CN | 110740613 A | 1/2020 |
| CN | 110913666 A | 3/2020 |

\* cited by examiner

AIRCRAFT AND METHOD FOR THERMAL MANAGEMENT

CROSS-REFERENCE TO RELATED APPLICATIONS

This application is a continuation of U.S. patent application Ser. No. 16/831,149 filed Mar. 26, 2020, titled AIRCRAFT AND METHOD FOR THERMAL MANAGEMENT, the disclosure of which is hereby incorporated by reference in its entirety as though fully set forth herein.

TECHNICAL FIELD

The disclosure generally relates to a thermal management system and more specifically to a thermal management system for an aircraft.

BACKGROUND

Electronic components are utilized in a wide variety of applications including for controlling operations of components or systems or for the supplying of heat, light, or power. For example, in an aircraft environment, electronic components or avionics can be utilized to control the various equipment and operations for flying the aircraft. The electronic components can be stored in a chassis, such as for protecting the avionics from environmental exposure. Electronic components can also generate heat during operation.

BRIEF DESCRIPTION

In one aspect, the disclosure relates to an aircraft. The aircraft includes at least one of a fuselage, a wing, a skin, or a support structure, an avionics unit adapted to store at least one heat generating component, a first interface operably coupled to the avionics unit and thermally coupled to the at least one heat generating component, and a plurality of heat pipes, wherein a first end of the plurality of heat pipes is coupled to the first interface, defining a hot interface, and a second end of the heat pipes is coupled to the at least one of the fuselage, the wing, the skin, or the support structure.

In another aspect, the disclosure relates to a thermal management system. The thermal management system includes an avionics unit defining an interior configured to house at least one heat generating component, and a first plurality of heat pipes, wherein a first end of the first plurality of heat pipes is coupled to the avionics unit, and defines a hot interface, and a second end of the first plurality of heat pipes is coupled to a portion of an aircraft that is exposed to an external environment outside the aircraft.

In another aspect, the disclosure relates to a method of thermal management. The method includes transferring heat from at least heat generating component to a first set of heat pipes located within in avionics unit, transferring heat from the first set of heat pipes, within the avionics unit, to a cold plate located on an exterior of the avionics unit, and transferring heat from a first end of a second set of heat pipes to a second end of the second set of heat pipes at least one of a fuselage, a wing, a skin, or a support structure of the aircraft.

DETAILED DESCRIPTION

Figure 1:
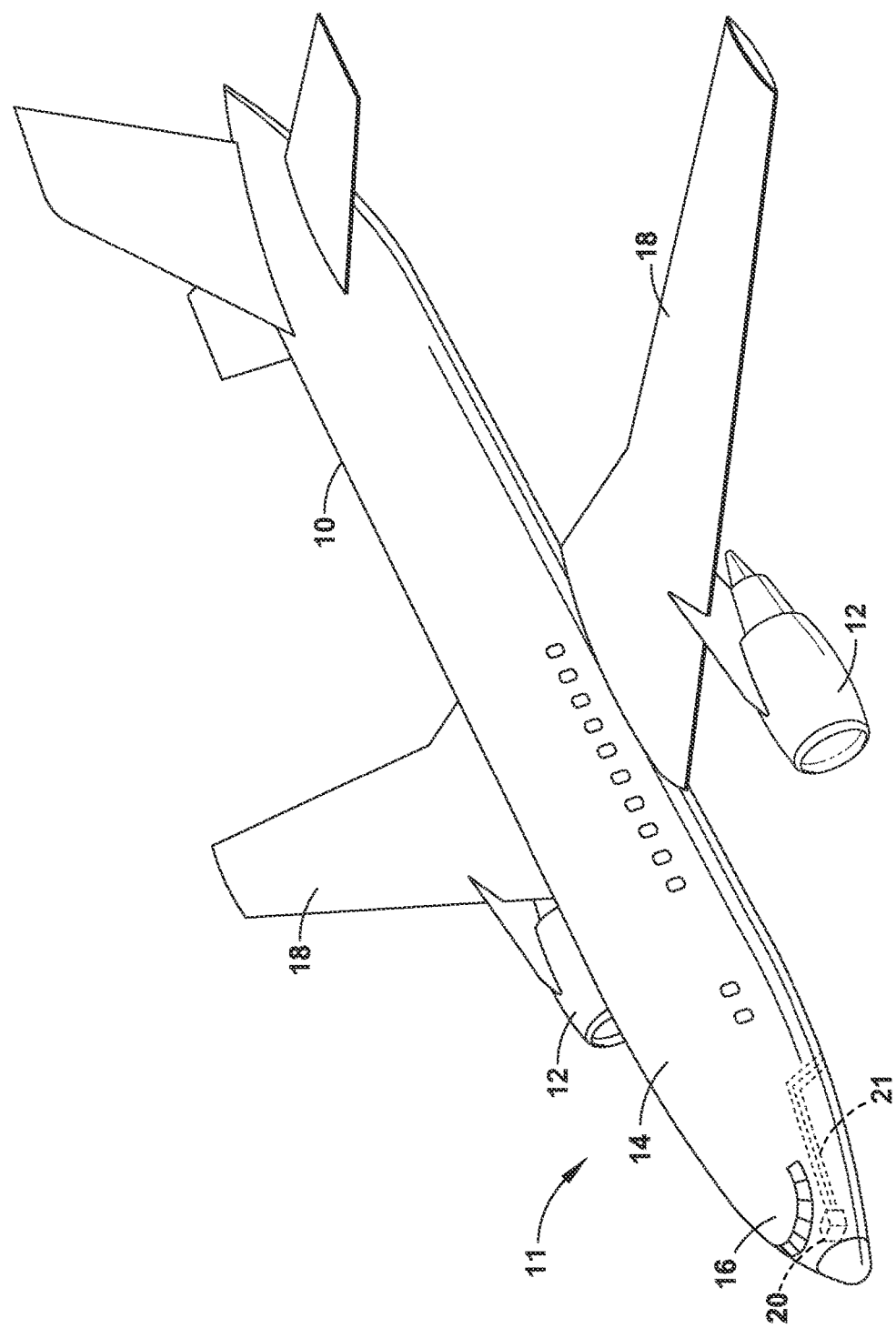
FIG. 1 is a perspective view of an aircraft having an avionics unit and heat pipes.

Aspects of the present disclosure describe a thermal management system configured to provide cooling for heat generating components within an electronics chassis housing of an aircraft. For the purposes of illustration, the thermal management system of the present disclosure will be described with respect to identify multiple ways to not only cool a high powered computing unit within an aircraft, such as an electronics chassis, but to do so in a way that places less of a heat load on the Environmental Control System (ECS). It will be understood that the present disclosure is not so limited and can also have general applicability in non-aircraft environments, such as ground-based electrical systems or solar power distribution systems, and may also be used to provide benefits in industrial, commercial, and residential applications.

While aspects of the disclosure can have general applicability, a thermal management system will be described in an exemplary application of an avionics chassis. For example, aircraft and avionics can have high power demands or high-power density, and more efficient electrical and thermal management can be desirable for such applications. In such an environment, the thermal management system as described herein can use fundamental technologies such as passive cooling techniques that significantly reduce heat and reject the waste heat to the exterior of the aircraft, which can reduce costs for implementing cooling solutions.

All directional references (e.g., radial, axial, proximal, distal, upper, lower, upward, downward, left, right, lateral, front, back, top, bottom, above, below, vertical, horizontal, clockwise, counterclockwise, upstream, downstream, forward, aft, etc.) are used only for identification purposes to aid the reader's understanding of the present disclosure, and should not be construed as limiting on an embodiment, particularly as to the position, orientation, or use of aspects of the disclosure described herein. Connection references (e.g., attached, coupled, fixed, connected, joined, and the like) are to be construed broadly and can include intermediate members between a collection of elements and relative movement between elements unless otherwise indicated. As such, connection references do not necessarily infer that two elements are directly connected and in fixed relation to one another. The singular forms "a", "an", and "the" include plural references unless the context clearly dictates otherwise. Furthermore, as used herein, the term "set" or a "set" of elements can be any number of elements, including only one.

Approximating language, as used herein throughout the specification and claims, is applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value, or the precision of the methods or machines for constructing or manufacturing the components and/or systems. For example, the approximating language may refer to being within a 10 percent margin.

The exemplary drawings are for purposes of illustration only and the dimensions, positions, order and relative sizes reflected in the drawings attached hereto can vary. Additionally, as used herein, elements being "electrically connected," "electrically coupled," or "in signal communication" can include an electric transmission or signal being sent, received, or communicated to or from such connected or coupled elements. Furthermore, such electrical connections or couplings can include a wired or wireless connection, or a combination thereof.

Also, as used herein, the term "satisfies" regarding a threshold value is used to mean that the respective value or values satisfy the predetermined threshold, such as being equal to or less than the threshold value, or being within the threshold value range. For example, if a sensed value falls below a threshold value, the sensed value can "satisfy" the threshold. Additionally, as used herein, the term "exceeds" regarding a threshold value is used to mean that the respective value does not satisfy the predetermined threshold, such as being outside of a threshold value range, falling above a maximum threshold, or falling below a minimum threshold. For example, if a sensed value falls below a minimum threshold, the value can "exceed" the threshold. It will be understood that such a determination may easily be altered to be satisfied by a positive/negative comparison, exceeding comparison, or a true/false comparison.

FIG. 1 schematically depicts an aircraft 10 that can include one or more propulsion engines 12 coupled to a fuselage 14, a cockpit 16 positioned in the fuselage 14, and wing assemblies 18 extending outward from the fuselage 14. While illustrated in a commercial airliner, aspects of the disclosure can be utilized in any type of aircraft, for example, without limitation, fixed-wing, rotating-wing, rocket, commercial aircraft, or personal aircraft. Furthermore, aspects of the disclosure are not limited only to aircraft aspects, and can be included in other mobile and stationary configurations. Non-limiting examples of such mobile configurations can include ground-based, water-based, or additional air-based vehicles.

The aircraft 10 can include an on-board chassis or avionics unit 20 (shown in phantom) for housing heat generating components. In a non-limiting example, the avionics unit 20 can be in the form of an electronics chassis for housing heat generating avionics or avionics components for use in the operation of the aircraft 10. The avionics unit 20 can include thermal management members including, but not limited to, heat spreaders, heatsinks, heat exchanger, or radiators. The avionics unit 20 can be configured to house a variety of electronic components or avionics elements and protect them against contaminants, electromagnetic interference (EMI), radio frequency interference (RFI), vibrations, and the like, or combinations thereof.

While illustrated proximate to the cockpit 16, it will be understood that the avionics unit 20 can be located anywhere within the aircraft 10. For example, the avionics unit 20 can be located in the cockpit 16, in a cabin of the aircraft 10, or in a storage bay within the aircraft in further non-limiting examples.

According to aspects of the present disclosure a plurality of heat pipes 21 (shown in phantom), which can be fixed or modular, are operably coupled to the avionics unit 20. A heat pipe is a heat-transfer device that combines the principles of both thermal conductivity and phase transition to effectively transfer heat between two interfaces, generally a hot interface and a cold interface. At the hot interface of a heat pipe, a liquid within the heat pipe in contact with a thermally conductive solid surface turns into a vapor by absorbing heat from that surface. The vapor then travels along the heat pipe to the cold interface and condenses back into a liquid, releasing the latent heat. The liquid then returns to the hot interface through either capillary action, centrifugal force, or gravity, and the cycle repeats. Due to the very high heat transfer coefficients for boiling and condensation, heat pipes are highly effective thermal conductors.

FIG. 1 illustrates the plurality of heat pipes 21 located near the nose of the aircraft 10 in the lower hemisphere. It is contemplated that this may provide the most beneficial location as the nose underneath the aircraft may receive cold airflow during flight and be shielded from sun while not in flight. However, it will be understood that the plurality of heat pipes 21 can be located in any location within the aircraft 10 including that the hot end and cold end can be placed in any suitable locations. In the illustrated example, the plurality of heat pipes 21 can have a first end 21a coupled to the avionics unit 20 and a second end 21b coupled to the fuselage 14 or a skin of the aircraft. In other non-limiting examples, the second end 21b of the plurality of heat pipes 21 can be coupled to the wing 18, another support structure within the aircraft, or an exterior portion of the aircraft 10. In addition, the second end 21b can be exposed to ambient air outside the aircraft 10.

Figure 2:
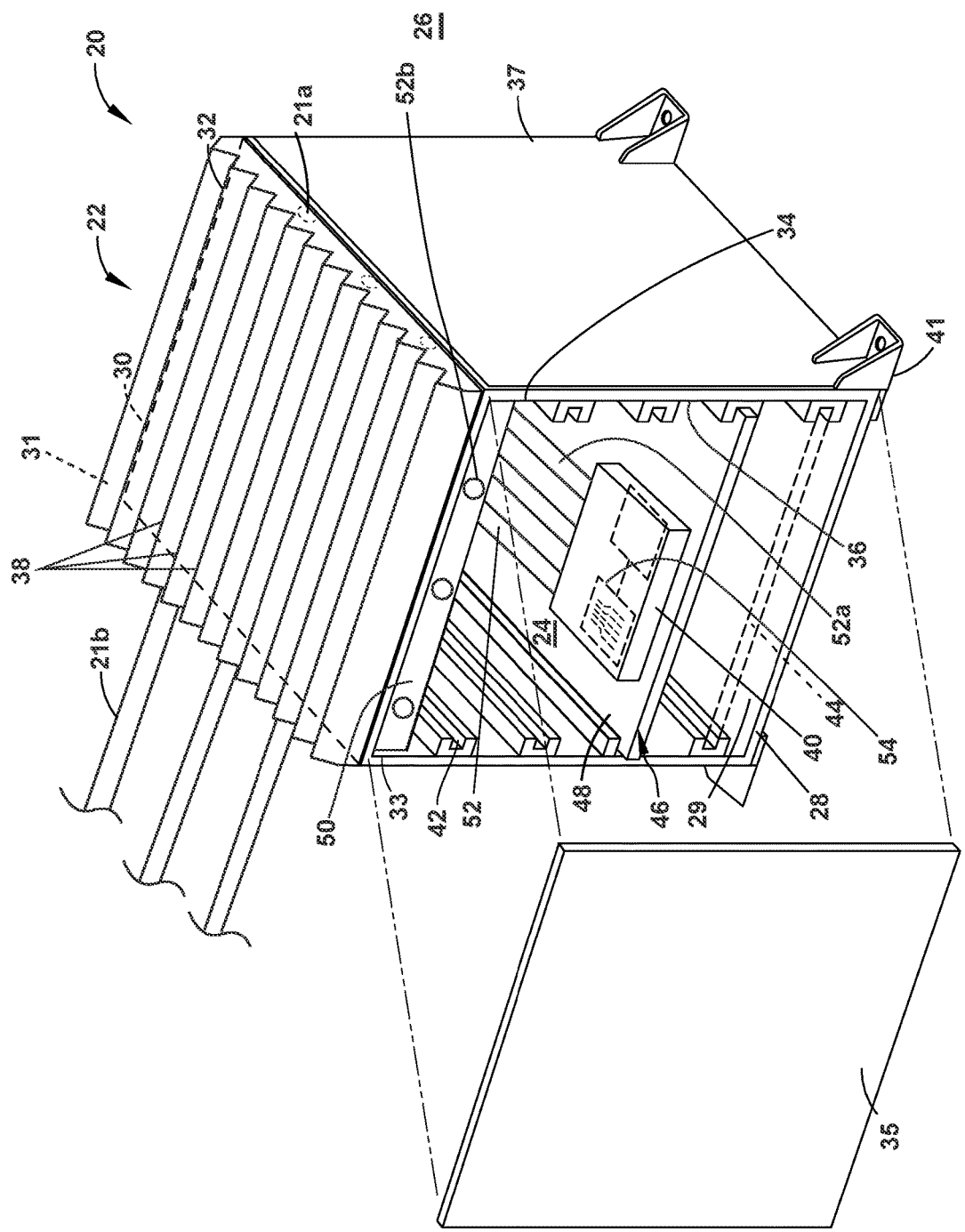
FIG. 2 is a perspective view of the avionics unit of FIG. 1 in the form of an electronics chassis with a thermal management system in accordance with various aspects described herein.

FIG. 2 illustrates the avionics unit 20 in the form of a chassis. In further detail, the avionics unit 20 can include a housing 22 defining an interior 24 and exterior 26. The avionics unit 20 can include a frame 28 having a top cover 30, a bottom wall 29, a back wall 32, and opposing sidewalls 33, 34. The frame 28 can further include a removable front cover 35, providing access to the interior 24 of the avionics unit 20 when removed, and at least partially restricting access to the interior 24 when coupled or mounted to the frame 28. In addition, the sidewalls 33, 34 can include an interior surface 36 and an exterior surface 37. The frame can be formed from any suitable material, such as aluminum or steel in non-limiting examples.

Optionally, a set of mounting feet 41 can extend from the housing 22 to facilitate mounting the avionics unit 20 to the aircraft 10 by means of bolts or other suitable fasteners. The set of mounting feet 41 can also function to electrically ground the avionics unit 20 to the frame of the aircraft 10. While the example of FIG. 2 illustrates the set of mounting feet 41, any desired type of attachment mechanism can be utilized to secure or ground the avionics unit within the aircraft 10. The avionics unit 20 can further include a set of card rails 42 within the interior 24 and supported by the interior surface 36 of the sidewalls 33, 34. The set of card rails 42 can be horizontally aligned on the interior surfaces 36 and spaced on opposing sidewalls 33, 34 to define effective card slots 44 (illustrated by the phantom lines). An avionics system 46 including at least one avionics system card 48 can be housed within the avionics unit 20 by way of the card slots 44, wherein each card slot 44 can be configured to receive at least a portion of an avionics system card 48. While only one avionics system card 48 is shown, the avionics unit 20 can be configured to house, support, or include any number of avionics system cards 48.

Each avionics system card 48 can include a set of wires (not shown). The set of wires can be formed of any suitable material, including copper or aluminum. At least one heat generating electronic component 54 can also be provided on the avionics system card 48. It should be understood that the set of wires can be used within the electronic component 54 or to connect multiple electronic components 54, or anywhere else within or on the avionics system card 48 as desired.

Heat generating components 54 in avionics can produce high heat loads, and traditional devices for heat dissipation can introduce an appreciable amount of extra weight to the aircraft. It can be beneficial to transfer heat both within the avionics unit and transfer heat from the avionics unit to structural portions of the aircraft that can dissipate the heat load to, by way of non-limiting example, ambient air exterior of the aircraft.

Aspects of the present disclosure include a thermal management system 11. The thermal management system 11 includes the heat management exterior 26 of the avionics unit and the interior 24 of the avionics unit 20. Exterior 26 of the avionics unit 20 can include a cold plate 31, which can form a first interface or a hot interface. More specifically the cold plate 31 is mounted to the avionics unit 20 and thermally coupled thereto. In this manner the cold plate 31 is thermally coupled to the heat generating component located therein. For example, cold plate 31 can be thermally coupled to a heat spreader 50 located on the interior 24 of the avionics unit 20. The plurality of heat pipes 21 (FIG. 1) can also thermally couple to such cold plate 31. For example, a first end 21a of the plurality of heat pipes 21 can be thermally coupled to the cold plate 31. In the illustrated example the first end 21a is illustrated as being embedded into the cold plate 31. The second end 21b of the plurality of heat pipes 21 can be coupled to a structure of the aircraft.

A plurality of heat-dissipating fins 38 can extend from the exterior surface of the cold plate 31. While other configurations are possible, the heat-dissipating fins 38 are illustrated having the same orientation as plurality of heat pipes 21 located therein and commensurate with the length of the cold plate 31. The heat-dissipating fins 38 could be in alternative configurations including being only part of the length, having sets along the length, or running perpendicular to the plurality of heat pipes 21. The heat-dissipating fins 38 increase the exterior surface area of the cold plate 31 and allow some heat to be transferred to the surrounding air through convection.

A heatsink 40 may be mounted directly to the PCB or heat generating component 54 or through a thermal pad. The heatsink 40 and any thermal pad may be made of any thermally conductivity material. The heatsink 40 or any thermal pad may be located such that it directly contacts the heat generating component 54. While the heatsink 40 has been illustrated as a plane it will be understood that it may also be a bar, strap, or other configuration.

The heatsink 40 can include a second plurality of heat pipes or a set of embedded heat pipes 52. The set of embedded heat pipes 52 can be formed of any suitable material, including copper or aluminum. The set of embedded heat pipes 52 can have a hot end 52a coupled to or embedded within the heatsink 40 and a cold end 52b coupled to or embedded in a heat spreader 50 that is located within the avionics unit 20. The heat spreader 50 can be thermally coupled to the avionics unit 20 and mounted thereto. FIG. 2 illustrates the heat spreader 50 thermally coupled to the interior 24 of the top cover 30 of the housing 22. It should be appreciated that the heat spreader 50 can be organized in multiple configurations.

During operation, heat is generated by the one or more heat generating components 54 and managed by the thermal management system 11. A thermal path in the thermal management system 11 begins with the heat generating component 54. Heat is conducted from the heat generating component 54 through the heatsink 40 to the second set of heat pipes 52, which in turn transfers the heat to the heat spreader 50. The heat is conductively transferred from the heat spreader 50 to the cold plate 31 via avionics unit 20. Heat may be conducted to the heat-dissipating fins 38 where heat may then be dissipated through convection into the air surrounding the heat-dissipating fins 38. The amount of heat dissipated via the heat-dissipating fins 38 is minimal compared to the transfer of heat from the cold plate 31 to the first set of heat pipes 21. Heat is transferred from the hot end or first end 21a of the first set of heat pipes 21, which can be coupled to or embedded in the cold plate 31, to the cold end or second end 21b of the heat pipes 21, which are thermally coupled to an aircraft structure. The aircraft structure can be located such that the heat is then rejected to ambient air located on the exterior of the aircraft 10.

Figure 3:
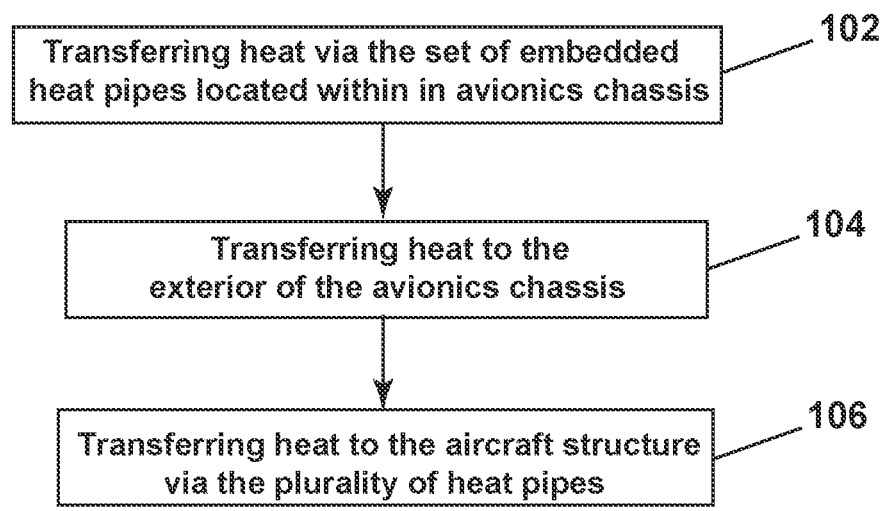
FIG. 3 is a flow chart diagram illustrating a method of the thermal management system.

FIG. 3 flowchart illustrates a method 100 of operation of the thermal management system 11 in accordance with the operation described above. The method 100 can include transferring heat, at 102, via the at least one heat generating component 54 through the heatsink to the second set of heat pipes 52 located within the avionics unit 20. At 102, heat can be transferred from the second set of heat pipes 52 to the heat spreader 50. Furthermore, at 104, heat can be transferred to the exterior of the avionics unit 20. For example, this can include transferring heat to a first interface formed by the cold plate 31. This can be accomplished as the heat spreader 50 is thermally coupled to the cold plate 31, which are both thermally coupled to the housing 22 of the avionics unit 20. Optionally, heat may be conduct to the heat-dissipating fins 38 then dissipate to the air surrounding the avionics unit 20. At the first interface, heat is transferred from the cold plate 31 to the first set of heat pipes 21. At 106, heat can also be transferred from the first set of heat pipes 21 to a portion of the aircraft's structure, such as the wing 18, the fuselage 14, the skin of the aircraft. In turn, heat can be rejected from this portion of the aircraft structure to ambient air located on the exterior of the aircraft.

Figure 4:
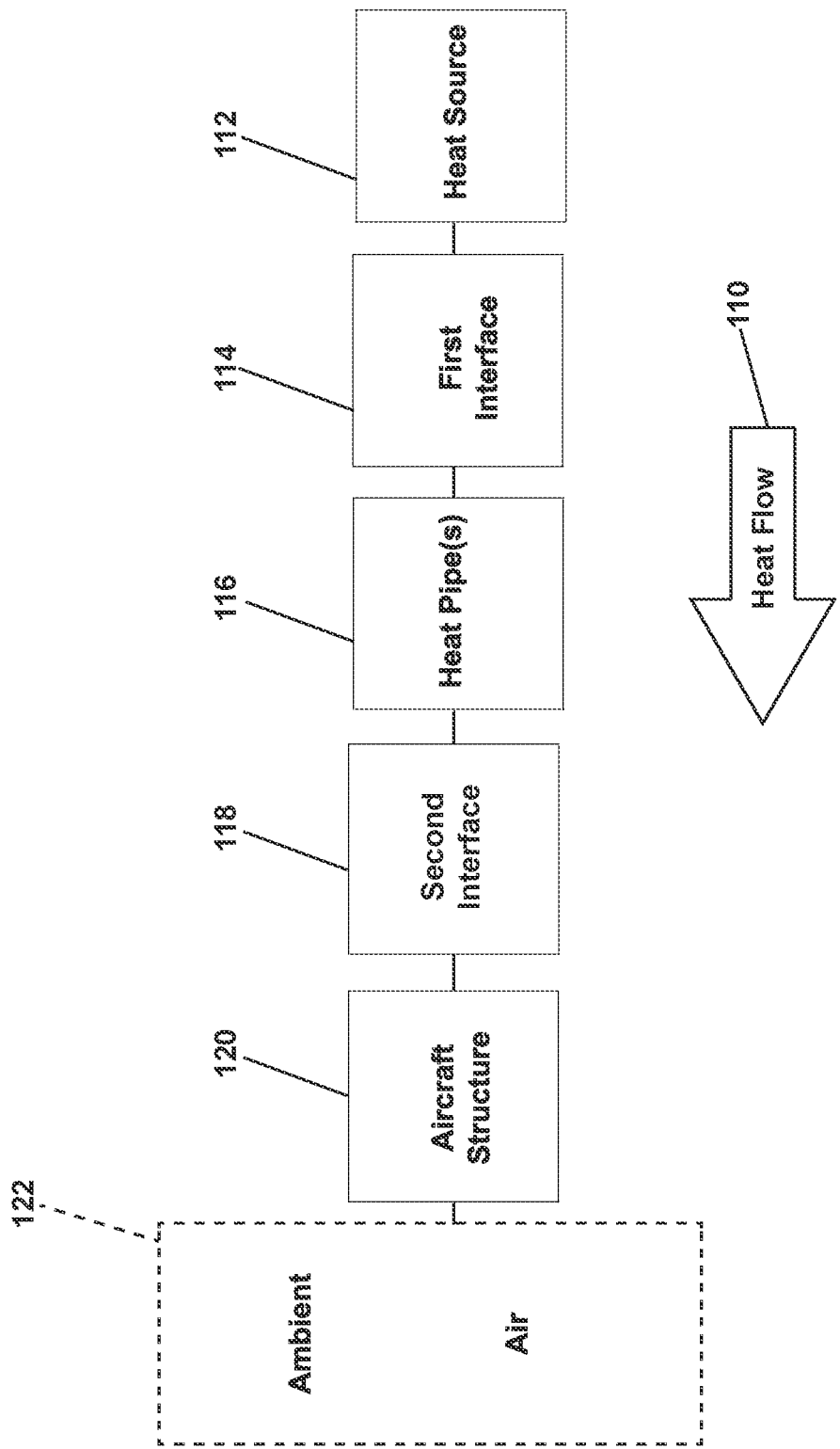
FIG. 4 is a block diagram illustrating the method of the thermal management system.

FIG. 4 schematically illustrates the direction of heat flow, indicated overall with arrow 110, beginning at the heat source 112 formed by the one or more heat generating components. It will be understood that the heat source 112 in this schematic illustration encompasses the entire avionics unit 20. Heat can be transferred to the cold plate 31, which is thermally coupled thereto. The cold plate 31 forms the first interface 114, which can also be referred to as the hot interface. Heat is transferred from the first interface 114 through a plurality of heat pipes 116. A second interface 118, or cold interface, thermally couples the cold end of the heat pipes 116 to the aircraft structure 120. Heat can then transfer from the aircraft structure 120 to ambient air located outside of the aircraft 122.

Some advantages associated with the disclosure discussed herein can include, but are not limited to, reducing cost for implementing cooling solutions within an aircraft, give an alternative to thermal management with technologies that have space constraints, as well as give an alternative to applications where no cooling is currently provided. Aircraft have traditionally used the mass of fuel or air internal to the aircraft structure as a sink to which waste heat can be rejected. For example, ECS systems can utilize forced convection with liquid or air cooling, driven by fans and pumps that draw their power from the aircraft engines through engine bleed-air or electrical generators. Aspects of the present disclosure are passive and do not require such fans, pumps, power input, etc. Another advantage associated with the disclosure discussed herein can include eliminating the need for moving mechanical parts used for cooling purposes such as fans, or duct air components.

Additionally, heat pipes are highly reliable and suitable for long service life, which can also benefit thermal systems. Heat pipes are also able to exhibit extremely high apparent thermal conductivity because of their two-phase system, which can also be transferred over relatively long distances, while maintaining low weight due to their hollow tubing. An advantage of being coupled to a structure that is on an exterior of the aircraft is that ambient air temperature of the standard atmosphere approaches −55 degrees Celsius at typical commercial aircraft cruising altitudes creating optimal temperature for heat to be extracted from the heat pipes through convection. Another advantage associated with the disclosure is that using heat pipes allows for omitting any components requiring electrical power, which can in turn reduce power needs for the aircraft, simplify mechanical designs of avionics, and reduce complexity of an entire cooling system. Another advantage of the system is that the system increases the flexibility that the airframer has in placing units on the aircraft.

Many other possible configurations in addition to those shown in the above figures are contemplated by the present disclosure. To the extent not already described, the different features and structures of the various aspects can be used in combination with others as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

Further aspects of the invention are provided by the subject matter of the following clauses:

An aircraft, comprising, at least one of a fuselage, a wing, a skin, or a support structure, an avionics unit adapted to store at least one heat generating component, a first interface operably coupled to the avionics unit and thermally coupled to the at least one heat generating component, and a plurality of heat pipes, wherein a first end of the plurality of heat pipes is coupled to the first interface, defining a hot interface, and a second end of the heat pipes is coupled to the at least one of the fuselage, the wing, the skin, or the support structure.

The aircraft of any preceding clause wherein the avionics unit comprises an electronics chassis having an exterior and defining an interior for housing the at least one heat generating component.

The aircraft of any preceding clause wherein the first interface comprises a cold plate operably coupled to the electronics chassis and thermally coupled to the at least one heat generating component.

The aircraft of any preceding clause wherein the cold plate is mounted to the exterior of the electronics chassis and the cold plate comprises a set of fins extending therefrom.

The aircraft of any preceding clause wherein the set of fins are parallel with the plurality of heat pipes.

The aircraft of any preceding clause wherein the first end of the plurality of heat pipes is embedded in the cold plate.

The aircraft of any preceding clause, further comprising a heat spreader having a body located within the interior.

The aircraft of any preceding clause wherein the heat spreader further comprises a set of embedded heat pipes with a hot end of the set of embedded heat pipes thermally coupled to the heat generating component via a heatsink.

The aircraft of any preceding clause, wherein the avionics unit is a line replaceable unit.

The aircraft of any preceding clause, wherein the at least of the fuselage, the wing, the skin, or the support structure is in a lower hemisphere of the aircraft.

The aircraft of any preceding clause, wherein the at least one of the fuselage, the wing, the skin, or the support structure is partially exposed to an external environment.

A thermal management system, comprising: an avionics unit defining an interior configured to house at least one heat generating component; and a first plurality of heat pipes, wherein a first end of the first plurality of heat pipes is coupled to the avionics unit, and defines a hot interface, and a second end of the first plurality of heat pipes is coupled to a structural portion of an aircraft that is thermally coupled to an external environment outside the aircraft.

The thermal management system of any preceding clause wherein the hot interface further comprises a cold plate operably coupled to the avionics unit.

The thermal management system of any preceding clause wherein the first end of the first plurality of heat pipes is embedded in the cold plate.

The thermal management system of any preceding clause, further comprising a second plurality of heat pipes, wherein a hot end of the second plurality of heat pipes is thermally coupled to the at least one heat generating component via a heatsink and a cold end of the second plurality of heat pipes is thermally coupled to the cold plate.

The thermal management system of any preceding clause, further comprising a heat spreader having a body located within the interior and thermally between the cold end of the second plurality of heat pipes and the cold plate.

The thermal management system of any preceding clause wherein the second end of the second plurality of heat pipes are embedded in the heat spreader.

The thermal management system of any preceding clause wherein the avionics unit is a line replaceable unit.

The thermal management system of any preceding clause wherein the structural portion of the aircraft is in a lower hemisphere of the aircraft.

A method for thermal management, the method comprising: transferring heat from at least heat generating component to a first set of heat pipes located within in avionics unit; transferring heat from the first set of heat pipes, within the avionics unit, to a cold plate located on an exterior of the avionics unit; and transferring heat from a first end of a second set of heat pipes to a second end of the second set of heat pipes at least one of a fuselage, a wing, a skin, or a support structure of the aircraft.

This written description uses examples to disclose aspects of the invention, including the best mode, and also to enable any person skilled in the art to practice aspects of the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A passive cooling system for aircraft electronics, the system comprising:
   an electronics chassis having a chassis exterior and defining a chassis interior;
   a heat spreader having a body located in the chassis interior;
   a heatsink located in the chassis interior;

a cold plate operably coupled to the electronic chassis and thermally coupled to the heatsink;

a first plurality of heat pipes thermally coupled with the cold plate; and a second plurality of heat pipes thermally coupling the heatsink with the heat spreader.

2. The passive cooling system of claim 1, wherein the cold plate is mounted to the chassis exterior and the cold plate comprises a set of fins extending therefrom.

3. The passive cooling system of claim 1, wherein the heat spreader and the cold plate are operably coupled to opposite sides of a portion of the electronic chassis.

4. The passive cooling system of claim 1, wherein first ends of the first plurality of heat pipes are embedded in the cold plate.

5. The passive cooling system of claim 4, wherein second ends of the first plurality of heat pipes are thermally coupled to an exterior of an aircraft.

6. The passive cooling system of claim 5, wherein a thermal path of the aircraft includes a first heat transfer path from the heatsink to the second plurality of heat pipes, a second heat transfer path from the second plurality of heat pipes to the heat spreader, a third heat transfer path from the heat spreader to the cold plate via the electronics chassis, a fourth heat transfer path from the cold plate to the first plurality of heat pipes, and a fifth heat transfer path from the first plurality of heat pipes to the exterior of the aircraft.

7. The passive cooling system of claim 1, wherein first ends of the second plurality of heat pipes are embedded in the heatsink.

8. The passive cooling system of claim 7, wherein second ends of the second plurality of heat pipes are embedded in the heat spreader.

9. The passive cooling system of claim 1, wherein the heatsink is in direct contact with a heat generating component located in the chassis interior.

10. The passive cooling system of claim 1, wherein the first plurality of heat pipes are modular.

11. The passive cooling system of claim 1, wherein the second plurality of heat pipes are adapted to utilize thermal conductivity and phase transition to transfer heat from the heatsink to the heat spreader.

12. The passive cooling system of claim 11, wherein the second plurality of heat pipes provide a closed loop heat transfer path between the heatsink and the heat spreader.

13. The passive cooling system of claim 1, wherein the first plurality of heat pipes and the second plurality of heat pipes are not fluidly coupled to a component that consumes electrical power.

14. The passive cooling system of claim 1, wherein the first plurality of heat pipes and the second plurality of heat pipes have closed first ends and closed second ends.

15. A method for passive thermal management, the method comprising:

transferring heat from a heat generating component located in an avionics unit to a heat spreader located within the avionics unit, the avionics unit comprising an electronics chassis;

transferring heat from the heat spreader to a cold plate operably coupled with the avionics unit; and transferring heat from the cold plate to at least one of a fuselage, a wing, a skin, or a support structure of an aircraft that is thermally coupled to an external environment outside the aircraft.

16. The method of claim 15, wherein transferring heat from the cold plate includes transferring heat via a first plurality of heat pipes, the first plurality of heat pipes including first ends thermally coupled to the cold plate and second ends thermally coupled to the at least one of the fuselage, the wing, the skin, or the support structure.

17. The method of claim 16, wherein transferring heat from the heat generating component includes transferring heat via a second plurality of heat pipes, the second plurality of heat pipes including first ends thermally coupled to a heatsink located in the avionics unit and second ends thermally coupled to the cold plate via the heat spreader.

18. The method of claim 17, wherein the second plurality of heat pipes include hot ends and cold ends;

wherein a liquid is disposed in the second plurality of heat pipes; and wherein transferring heat via the second plurality of heat pipes is a passive process including:
(a) the liquid absorbing heat from the hot ends,
(b) the liquid turning into vapor via the absorbed heat,
(c) the vapor traveling along the second plurality of heat pipes to the cold ends,
(d) the vapor condensing in the cold ends back into the liquid to release heat to the heat spreader, and
(e) the condensed liquid returning to the hot ends.

19. The method of claim 18, wherein transferring heat via the second plurality of heat pipes including repeating steps (a)-(e).

20. The method of claim 18, wherein steps (a)-(e) are conducted without consuming electrical power.

* * * * *